US006770412B2

(12) United States Patent
Gray et al.

(10) Patent No.: US 6,770,412 B2
(45) Date of Patent: Aug. 3, 2004

(54) BLACK AND WHITE PHOTOGRAPHIC MATERIAL

(75) Inventors: Colin J. Gray, Middlesex (GB); Christopher B. Rider, Surrey (GB)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/178,265

(22) Filed: Jun. 24, 2002

(65) Prior Publication Data

US 2003/0036026 A1 Feb. 20, 2003

(30) Foreign Application Priority Data

Jul. 7, 2001 (GB) ............................................. 0116682

(51) Int. Cl.[7] ........................ G03C 1/047; G03C 1/053; G03C 5/04; G03F 1/12

(52) U.S. Cl. ....................... 430/264; 430/311; 430/327; 430/396; 430/564; 430/627; 430/628; 430/642

(58) Field of Search ................................. 430/311, 327, 430/396, 564, 627, 642, 264, 268, 628

(56) References Cited

U.S. PATENT DOCUMENTS 3,647,459 A * 3/1972 Taber et al. ................ 430/628
3,734,616 A 5/1973 Mayhew et al.
5,543,287 A * 8/1996 Arai ........................... 430/628
5,691,107 A 11/1997 Kaneko et al. ............. 430/267
6,171,752 B1 1/2001 Baker et al. ................ 430/264

FOREIGN PATENT DOCUMENTS

EP 0 643 326 A 3/1995
EP 0 716 338 A 6/1996
EP 0 735 416 A1 10/1996
EP 0 928 987 A 7/1999
JP 63-170638 7/1988

OTHER PUBLICATIONS

Anonymous, Research Disclosure #308119 "Photographic Silver Halide Emulsions, Preparations, Addenda, Processing and Systems", Dec. 1989, pp. 993–1015.

Eastman Kodak Company, "Dimensional Change Characteristics for Printed Circuit Board Films", Mar. 2001, Publication No. TI–2530, pp. 1–6.

* cited by examiner

*Primary Examiner*—Richard L. Schilling

(57) ABSTRACT

The invention provides black and white silver halide material for optical contact copying, comprising: at least one photographic emulsion layer including a silver-halide-containing matrix in which the matrix includes a polymer and a hydrophilic binder, wherein the ratio of the weight of silver in the emulsion layer to the weight of polymer in the emulsion layer per unit area is less than 2.0. The photographic material is suitable for use in optical contact copying providing reduced contact gain compared to that provided by conventional photographic material.

4 Claims, 2 Drawing Sheets

BLACK AND WHITE PHOTOGRAPHIC MATERIAL

FIELD OF THE INVENTION

The present invention relates to a black and white photographic material and in particular to a black and white photographic material suitable for use in optical contact copying. The invention also relates to a method of manufacturing a printed circuit board using the black and white photographic material.

BACKGROUND OF THE INVENTION

Black and white high contrast silver halide materials are used widely as originals for optical contact copying onto other photosensitive materials. For example in the printing industry, page separations are exposed by imagesetter onto film which is then copied (exposed) onto printing plates by ultra-violet (UV) contact exposure. The exposed printing plate is then processed to produce an ink-receptive image for printing on a press. Sometimes, pages are physically assembled by cutting and pasting images and text from various sources. The assembled page may then be copied by camera onto another sheet of film. This process also induces a feature size change before the final copying of this film image onto a printing plate which further exaggerates the size gain.

Another example of this type of process is the manufacture of printed circuit boards (PCBs) where electronic circuit track layouts are exposed by photoplotter onto film intermediates, called phototools or photomasks. FIG. 1 shows an arrangement for exposing an image through a photomask onto the circuit board. The photomask comprises a support 1 and an image layer 2 arranged thereon. The photomask is positioned immediately adjacent to a copper-clad, resist-covered PCB substrate on a contact-copying frame (not shown). To improve the intimacy of contact it is normal practice to evacuate air from the contact frame. Incident radiation such as UV light is provided by a source (not shown) within the contact frame and is received by the photomask and transmitted directly to the photoresist layer 4 through openings in the mask. The mask is a photographic film and openings in the mask correspond to minimum density regions of the image on the film.

The transmitted radiation causes a change in the properties of the photoresist, e.g., a hardening such that areas exposed to the radiation are physically different from those that have been hidden by the mask layer 2. After exposure the photoresist is processed to remove it from areas where it is desired to etch away the copper such that the resultant structure has regions of copper exposed and regions concealed by photoresist. The exposed areas of the copper are then etched. After etching, the remaining photoresist is removed from the PCB to reveal the track pattern.

A problem, known as contact gain, that exists with these kind of contact copying processes is that the image feature size on the copy is often slightly different from the feature size on the original mask. In the printing industry this effect is known as "dot gain", a typical measure of which is the % transmittance change of a black area, often a dot, within its total possible area, defined by the screen ruling. Thus if a dot obscuring 50% of the possible area it can occupy grows to 55% (or 45% depending on whether the printing plate is positive or negative working) on the copy, a dot gain of 5% has occurred.

In the PCB industry, contact gain can affect the width of features, e.g. tracks or lines, on a PCB and is referred to as "line width gain". Thus, if a 100 $\mu$m line becomes a 105 $\mu$m line on the photoresist, a line width gain of 5 $\mu$m would have occurred. In the example shown in FIG. 1, the regions of the negative-working photoresist 4 that have been exposed to the UV radiation are slightly larger than the corresponding openings in the mask 2 (where the contact gain is defined as the difference in the feature size of the copy from that of the original).

In addition to the problem of contact gain, it is known that the amount of contact gain may vary according to the position of any particular image point across the contact copying frame.

These gain effects make process control more difficult in both examples discussed above. The problem is becoming more severe as the average feature size to be copied is decreasing due to the drive to reduce track sizes on PCBs and to reduce screen ruling or to use stochastic screening techniques with very small dot size in the printing industry.

A further development in the printed circuit board industry is the use of dry film resist (as shown in FIG. 5) rather than the conventional liquid resist where the resist is applied directly to the substrate. As will be explained below, dry film resist is supplied as a roll comprising 3 layers: a carrier layer, a thin transparent support layer and a photoresist layer. The carrier layer is normally separated from the other 2 layers when the dry film resist is applied to the circuit board substrate. The photoresist support layer, for example a 20 $\mu$m thick Mylar™ film (polyethylene terephthalate) or any other UV transparent material, is placed uppermost on the circuit board with the photoresist layer directly on top of the copper. Thus the Mylar™ film separates the photomask and the photoresist. Given that feature sizes in printed circuit boards may now be approaching the thickness of the Mylar™ film, this separation represents a significant distance and further degrades the contact performance by increasing the contact gain of the system in comparison to use of liquid resists, where no support layer is necessary.

It is an aim of the present invention to reduce the amount of contact gain through improved design of the silver halide film original and thus facilitate process control.

It is also an aim of the present invention to provide a photographic material suitable for use in the manufacture of PCBs or the production of printing plates, adapted such that contact gain is minimized.

SUMMARY OF THE INVENTION

According to a first aspect of the present invention, there is provided a black and white silver halide material for optical contact copying, comprising: at least one photographic emulsion layer including a silver-halide-containing matrix in which the matrix includes a polymer and a hydrophilic binder. The ratio of the weight of silver in the emulsion layer to the weight of polymer in the emulsion layer per unit area is less than 2.0.

Preferably, the hydrophilic binder is gelatin. The polymer may be a polymer derived from the polymerization of one or more ethylenically unsaturated monomers. Preferably, the polymer is selected from a group consisting of acrylates, methacrylates, acrylamides and methacrylamides.

According to a second aspect of the present invention, there is provided a method of optical contact copying comprising the step of irradiating a substrate onto which a pattern is to be copied with radiation through an optical mask of the pattern, such that regions of the substrate are selectively exposed or hidden from the radiation. The mask is formed of a black and white photographic material according to the first aspect of the present invention.

Advantages of the Present Invention

It has been found that the amount of contact gain may be controlled by minimizing the coated weight of silver consistent with maintaining adequate maximum image density, together with maximizing the coated weight of polymer contained in the emulsion layer consistent with high quality manufacturing requirements.

BRIEF DESCRIPTION OF THE DRAWINGS

Examples of the present invention will now be described in detail with reference to the accompanying drawings, in which.

DETAILED DESCRIPTION OF THE INVENTION

Figure 1:
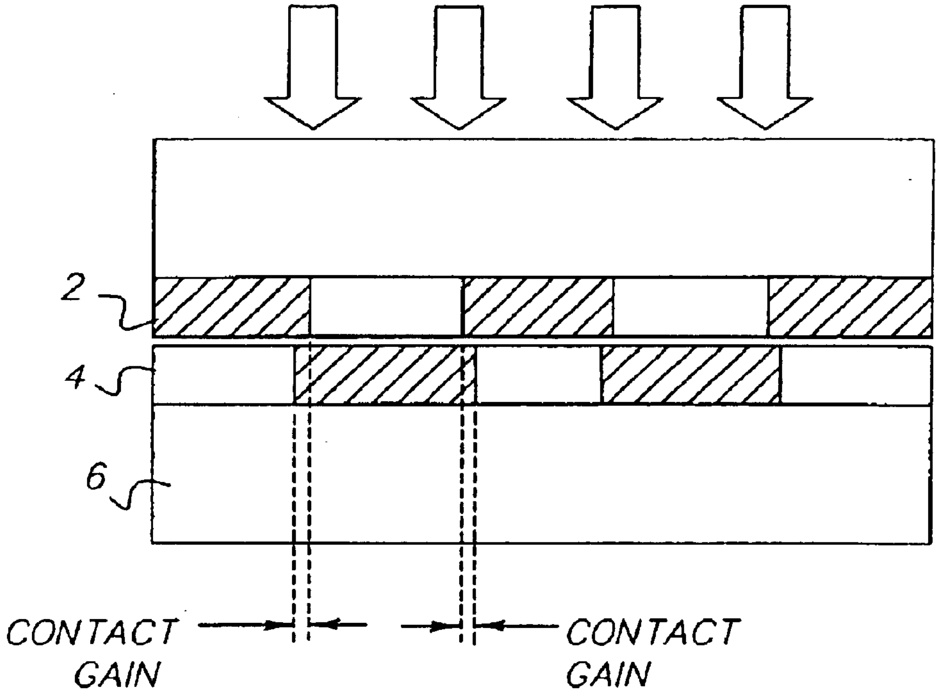
FIG. 1 shows a schematic representation of an example of a mask and photoresist arrangement demonstrating the problem of contact gain.
Figure 2:
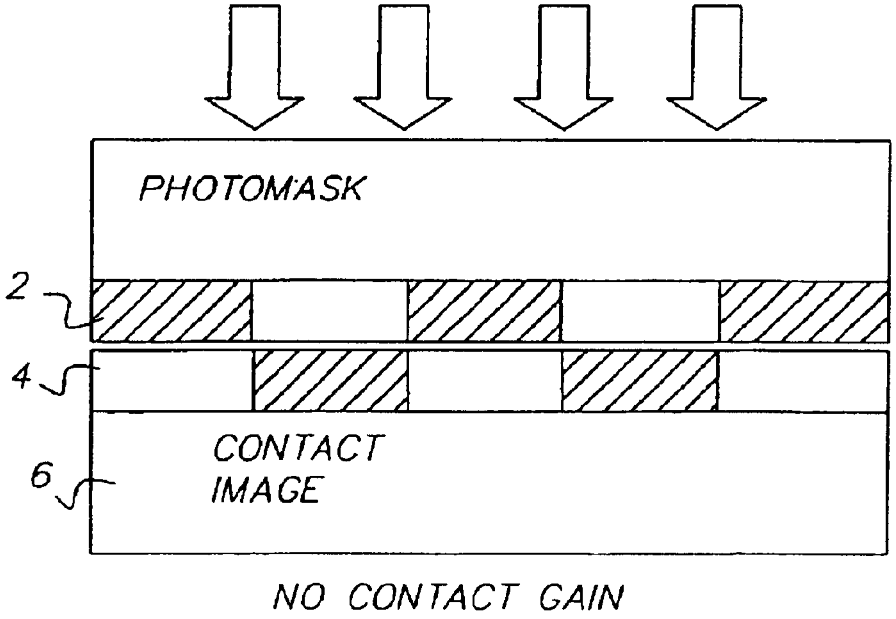
FIG. 2 shows a schematic representation of an example of an ideal mask and photoresist arrangement where there is no contact gain.

FIG. 2 shows a schematic representation of an example of a desired mask and photoresist arrangement. Like the arrangement of FIG. 1, the arrangement of FIG. 2 has a mask layer 2 arranged adjacent to a photoresist layer 4. In this example, the photoresist layer 4 is arranged on a copper image layer 6, which is to form the channels and connections of a PCB. Incident radiation such as ultra violet light is received by the mask layer 2 and transmitted as image information directly to the photoresist layer 4 through openings in the mask.

Properties of the photomask layer 2 are controlled to ensure that the problem of contact gain is overcome. As shown schematically in FIG. 2, in the present invention, the image transferred to the photoresist which will in turn be copied onto the copper image layer 6, corresponds almost exactly to that of the photomask layer 2. The problem of contact gain is substantially overcome.

Figure 3:
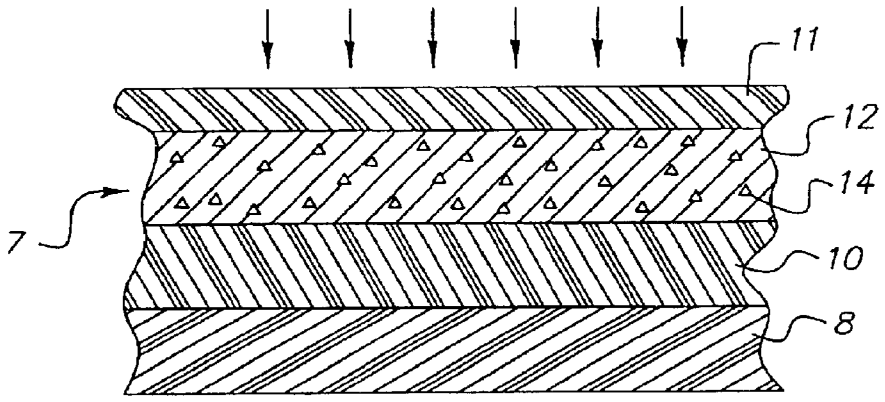
FIG. 3 shows an example of the layered structure of the photographic film according to an example of the present invention.

Contact gain reduction is achieved by decreasing the relative content of silver in the photographic emulsion layer of the photographic material as will be explained with reference to FIG. 3 which shows an example of the layered structure of photographic film 7 according to an example of the present invention. The film 7 has a base layer 8, an underlayer 10 and a photographic emulsion layer 12 containing silver halide grains 14. The base layer 8 may be formed from a polyester (ESTAR®) support.

In use, an image is exposed onto the film 7, creating a latent image in the silver halide grains 14. The exposed material is processed through developer, fixer and washing baths after which it is dried. The photographic emulsion layer 12 is formed of a matrix containing the silver halide grains 14. The matrix may be as described in Research Disclosure Item 308119, December 1989 published by Kenneth Mason Publications, Emsworth, Hants UK, hereinafter referred to as *Research Disclosure*. A hydrophilic colloid is used in the matrix such as gelatin or gelatin derivative, polyvinylpyrrolidone or casein and includes a polymer. Examples of suitable polymers are acrylates, methacrylates, acrylamides and methacrylamides, e.g., alkyl acrylates such as methyl acrylate and butyl acrylate, (methacryloyloxy)-ethylacetoacetate, and the sodium salt of 2-acrylamido-2-methylpropanesulphonic acid.

Suitable copolymers of the above monomers may be used, e.g., a copolymer of methyl acrylate, the sodium salt of 2-acrylamido-2-methylpropane sulphonic acid and 2-(methacryloyloxy)-ethylacetoacetate (88:5:7 by weight) and/or a copolymer of butyl acrylate, the sodium salt of 2-acrylamido-2-methylpropanesulphonic acid and 2-(methacryloyloxy)-ethylacetoacetate (90:4:6 by weight). A blend of two or more of the above polymers or copolymers may be employed.

The photographic material 7 may also include a supercoat hydrophilic colloid layer 11 which may also contain a vinyl polymer or copolymer located as the last layer of the coating (furthest from the base layer 8).

Figure 4:
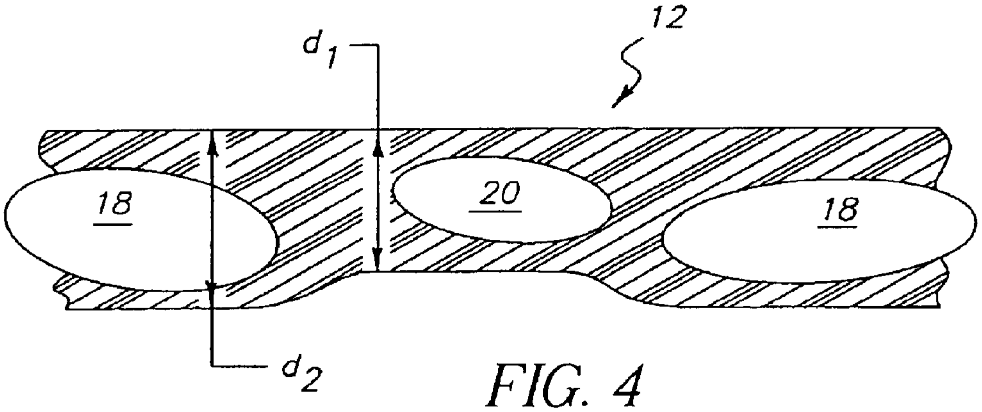
FIG. 4 shows an enlarged cross section of the emulsion layer of a photographic material after processing showing both image and non-image areas.

FIG. 4 shows a schematic representation of an enlarged cross section through the emulsion layer 12 of a photographic material according to the present invention. The emulsion layer 12 contains developed silver metal 18, which forms an image on the material. During processing of the photographic material, unexposed silver halide grains are removed, leaving a non-image area 20, from the emulsion layer 12 by a fixing agent. As the unexposed silver halide is removed a contraction occurs in the emulsion layer 12 such that the thickness $d_1$ of the emulsion layer 12 at a position where silver halide has been removed is less than the thickness $d_2$ of the emulsion layer 12 at a position where image silver has not been removed.

To control the amount of contact gain, careful selection of the coated weight of silver relative to the coated weight of the matrix per unit area is required. The gelatin, polymer and other binders in the emulsion layer of the film together form the carrier matrix for the silver halide crystals. The matrix may also include the gelatin, polymer and other components in other layers of the film, such as the underlayer 10 and supercoat (not shown). To reduce contact gain, the silver coated weight should be reduced whilst maintaining or increasing the coated weight of the carrier matrix and increasing its total polymer content. Preferably, the ratio of silver to polymer in the emulsion layer is maintained below 2.0. Alternatively, the ratio of silver to matrix in the emulsion layer is maintained below 0.95. In a further alternative, the desired reduction in contact gain may be achieved if the ratio of silver to matrix in all layers of the material is less than 0.45.

Figure 5:
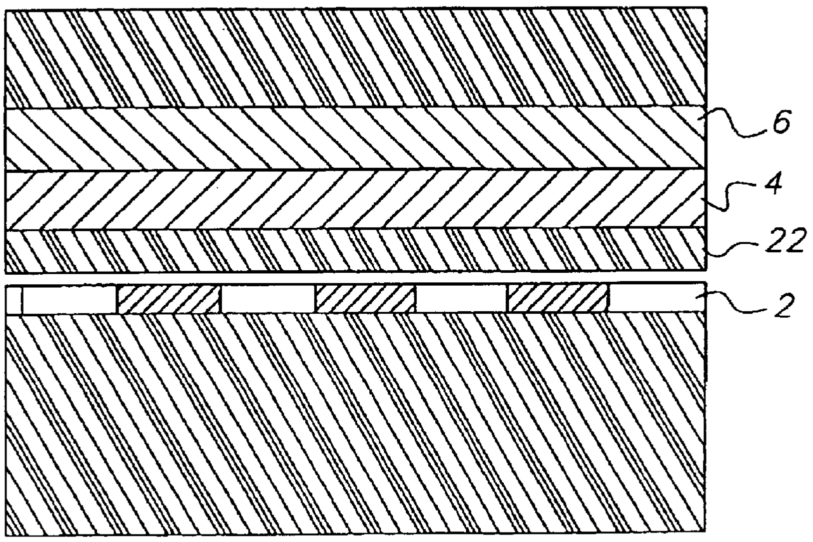
FIG. 5 shows an example of a mask and dry film photoresist arrangement.

FIG. 5 shows an example of a mask and dry film photoresist arrangement. Like the arrangements of FIGS. 1 and 2, the arrangement has a mask layer 2 and a photoresist layer 4 to receive transmitted radiation through openings in the mask layer 2. In this example, the photoresist layer 4 is arranged on a copper layer 6, which is to form the tracks and connections of a PCB. Dry film resist is supplied as a roll comprising three layers: a carrier layer (not shown), a thin transparent support layer 22 and a photoresist layer 4. The carrier layer is normally separated from the other two layers when the dry film resist is applied to a circuit board substrate having the copper layer 6. The photoresist support layer 22, for example a 20 $\mu$m thick Mylar film or any other UV transparent material, is placed uppermost on the PCB with the photoresist layer 4 directly on top of the copper layer 6. Thus, the Mylar film 22 is now separating the mask layer 2 and the photoresist layer 4. Given that feature sizes in PCBs approach the thickness of the Mylar film 22, this separation represents a significant distance.

EXAMPLE 1

Preparation of the coatings: The film coatings prepared consisted of a polyethylene terephthalate (ESTAR™) support on which was coated an antihalation underlayer, an emulsion layer, and a protective gelatin overcoat.

The underlayer consisted of 1.00 g gelatin/sq.m and a blend of latex copolymer of methyl acrylate, the sodium salt of 2-acrylamido-2-methylpropane sulphonic acid and 2-(methacryloyloxy)-ethylacetoacetate (88:5:7 by weight) at 1.00 g/sq.m. The layer also contained an amine booster of structure

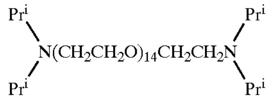

at 61.5 mg/sq.m and a solid particle antihalation dye of structure

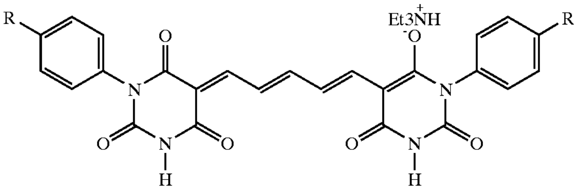

R = $CO_2H$ at 220 mg/sq.m.

The protective gelatin overcoat contained surfactants and was coated at a gelatin laydown of 1.465 g/sq.m. The layer also contained hydroquinone at 162.2 mg/sq.m and a solid particle safelight protection dye of structure

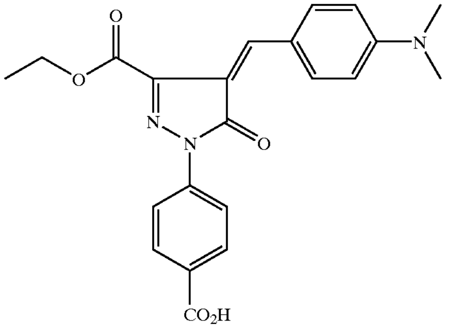

at 140 mg/sq.m.

The latent image forming emulsion layer consisted at a 70.30 chlorobromide cubic monodispersed emulsion (0.215 μm mean edge length) doped with a rhodium salt, chemically sensitized with sulphur and gold and spectrally sensitized with 190 mg/Ag mole of a trinuclear merocyanine sensitizing dye of structure

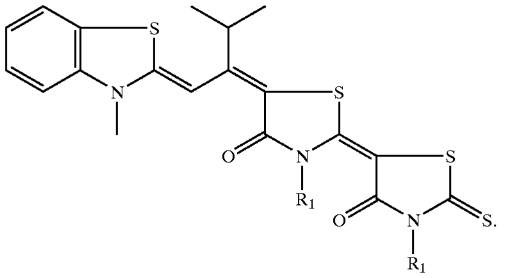

$R_1 = CH_2CO_2H$

The emulsion was coated at silver coverages as described in Table 1 below in a matrix of 1.85 g/sq.m gelatin and a blend of latex copolymer of methyl acrylate, the sodium salt of 2-acrylamido-2-methylpropane sulphonic acid and 2-(methacryloyloxy)-ethylacetoacetate (88:5:7 by weight), (POL "A"), as shown in Table 1 below. Other addenda included 2-mercaptomethyl-5-carboxy-4-hydroxy-6-methyl-1,3,3a,7-tetraazaindene,1-(3-acetamidophenyl)-5-mercaptotetrazole and 2,3-dihydro-2-thioxo-4-thiazoleacetic acid. The layer also contained 6.32 mg/sq.m of a nucleator compound of structure

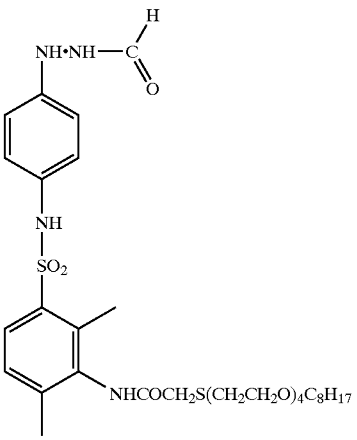

TABLE 1

| Coating | Ag (g/sq. m) | POL "A" (g/sq.m) | Ag/Total E-pol | Ag/Total E-Matrix | Ag/Total film matrix |
|---|---|---|---|---|---|
| A1 | 3.6 | 0.550 | 6.55 | 1.50 | 0.61 |
| A2 | 3.6 | 1.650 | 2.18 | 1.03 | 0.52 |
| A3 | 3.0 | 1.650 | 1.82 | 0.86 | 0.43 |

Table 1 above also shows the ratio values for silver:total emulsion layer polymer, silver:total emulsion layer matrix, and silver:total film matrix.

A line tint pattern was formed on the films as follows. The samples were exposed to WRATTEN™ 29 filtered light on a sensitometer which had been modified such that a line tint original (40 μmlines and 40 μmspaces) was placed over the conventional step tablet. The experimental film samples were placed in intimate contact with the tint original before the exposure was made, followed by development in KODAK™ ACCUMAX™ 2000RA developer (diluted 1+2) at 35° C. for 45 seconds, followed by conventional fixing, washing and drying.

The resultant line tint patterns were evaluated on an X-RITE™ densitometer in "dot %" mode, such that a patch on each experimental film was found and accurately measured corresponding to a reading of approximately 35%. The area was carefully marked, and the films placed on the glass of a KODAK™ CONTACT 2000™"2800" contact frame. The films were then covered with a sheet of 25 μmthick polyethylene terephthalate film support to exaggerate the effect of contact gain, and then with a sheet of KODAK ™ CONTACT 2000 ™ CA4 general purpose contact film. UV exposures were made corresponding to either 308 units exposure, or 715 units exposure. The CA4 film was processed in KODAK™ RA 2000 developer (diluted 1+4) at 35° C. for 30 seconds, followed by conventional fixing, washing and drying.

The "marked" areas from the originals were measured on the contact film, again using the X-RITE ™ densitometer in "dot %" mode. From these measurements the difference (dot gain) from the theoretical value (approximately 65%) could be measured. In addition, the actual line width gain was calculated from the dot gain figures, Table 2.

TABLE 2

| Coating | 308 units exp dot gain (%) | 308 units exp line gain (μm) | 715 units exp dot gain (%) | 715 units exp line gain (μm) |
|---|---|---|---|---|
| A1 | 11.4 | 9.1 | 16.9 | 13.5 |
| A2 | 9.2 | 7.4 | 14.0 | 11.2 |
| A3 | 8.4 | 6.7 | 13.3 | 10.6 |

It will be seen from the data in Table 2 that effect of line width gain on contacting, exaggerated using the spacer sheet between the film (photomask) and the photosensitive receiver, can be minimized by coating the minimum amount of silver, and the maximum amount of polymer, in the emulsion layer of the original photomask film material. In addition, and by reference to Table 1, it will be seen that the minimum line width gain can be obtained when the silver:emulsion layer polymer ratio is <2.0.

EXAMPLE 2

Coatings B1, B2 and B3 were prepared in exactly the same way as coatings A1, A2 and A3, respectively, except that an emulsion with grains 0.185 μmin mean edge length was used, and that spectral sensitization was carried out with 240 mg/Ag mole of trinuclear merocyanine sensitizing dye.

The samples for contacting were prepared in the same way as in Example 1, as were the subsequent evaluations. Table 3 shows the dot gain and line width gain results.

TABLE 3

| Coating | 308 units exp dot gain (%) | 308 units exp line gain (μm) | 715 units exp dot gain (%) | 715 units exp line gain (μm) |
|---|---|---|---|---|
| B1 | 10.8 | 8.6 | 16.7 | 13.4 |
| B2 | 10.0 | 8.0 | 15.1 | 12.1 |
| B3 | 8.0 | 6.4 | 12.6 | 10.1 |

Again, it will be seen from the data in Table 3 that the effect of line width gain on contacting, exaggerated using a spacer sheet between the film (photomask) and the photosensitive receiver, can be minimized by coating the minimum amount of silver, and the maximum amount of polymer, in the emulsion layer of the original photomask film material. In addition, and by reference to Table 1, it will be seen that the minimum line width gain can be obtained when the silver:emulsion layer polymer ratio is <2.0.

What is claimed is:

1. A method of optical contact copying adapted such that contact gain is minimized, comprising the steps of:

arranging an optical mask formed of a black and white photographic material adjacent to a substrate onto which a pattern is to be copied; and, irradiating said substrate with radiation through said optical mask, such that regions of the substrate are selectively exposed or hidden from the radiation, wherein said photographic material comprises at least one photographic emulsion layer including a silver-halide-containing matrix in which the matrix includes a polymer and a hydrophilic binder, wherein the ratio of the weight of silver in the emulsion layer to the weight of polymer in the emulsion layer per unit area is less than 2.

2. A method as claimed in claim 1 wherein said hydrophilic binder is gelatin.

3. A method as claimed in claim 1 wherein said polymer is a polymer derived from the polymerization of one or more ethylenically unsaturated monomers.

4. A method as claimed in claim 3 wherein said polymer is selected from the group consisting of acrylates, methacrylates, acrylamides and methacrylamides.

* * * * *